US012706568B2

(12) United States Patent
Manian et al.

(10) Patent No.: US 12,706,568 B2
(45) Date of Patent: Aug. 11, 2026

(54) DUAL-MODE LINE DRIVER FOR ETHERNET APPLICATIONS

(71) Applicant: Texas Instruments Incorporated, Dallas, TX (US)

(72) Inventors: Srikanth Manian, Bangalore (IN); Sumantra Seth, Bangalore (IN); Trilok Kamagond, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 749 days.

(21) Appl. No.: 17/972,532

(22) Filed: Oct. 24, 2022

(65) Prior Publication Data

US 2024/0136977 A1 Apr. 25, 2024
US 2024/0235480 A9 Jul. 11, 2024

(51) Int. Cl.
*H03F 1/02* (2006.01)
*H03F 3/45* (2006.01)

(52) U.S. Cl.
CPC .......... *H03F 1/02* (2013.01); *H03F 3/45475* (2013.01); *H03F 2200/129* (2013.01); *H03F 2200/91* (2013.01); *H03F 2203/45526* (2013.01); *H03F 2203/45528* (2013.01); *H03F 2203/45534* (2013.01)

(58) Field of Classification Search
CPC .. H03F 1/02; H03F 3/45475; H03F 2200/129; H03F 2200/91; H03F 2203/45526; H03F 2203/45528; H03F 2203/45534; H03F 2200/261
USPC .......................................................... 330/260
See application file for complete search history.

(56) References Cited

U.S. PATENT DOCUMENTS

2022/0321385 A1* 10/2022 Zhuang ............... H04L 25/0272
2023/0353184 A1* 11/2023 Mulder .................... H04B 1/40

FOREIGN PATENT DOCUMENTS

CN 210954175 U * 7/2020
CN 214622817 U * 11/2021

* cited by examiner

*Primary Examiner* — Andrea Lindgren Baltzell
*Assistant Examiner* — Lance Torbjorn Bartol
(74) *Attorney, Agent, or Firm* — Xianghui Huang; Frank D. Cimino

(57) ABSTRACT

A driver includes an operational amplifier which includes a first amplifier input coupled to a first driver input, a second amplifier input coupled to a second driver input, a first amplifier output, a second amplifier output, a third amplifier output and a fourth amplifier output. The first amplifier output is coupled to the first driver output and the third amplifier output is coupled to the second driver output in a voltage-mode operation. The second amplifier output is coupled to the first driver output and the fourth amplifier output is coupled to the second driver output in a current-mode operation.

17 Claims, 6 Drawing Sheets

$R_L$
$V_{OP}$
120
$V_{ON}$
122
100
$R_1$
$R_2$
$R_3$
$R_4$
$R_5$
$S_1$
$S_2$
$S_3$
$S_4$
$S_5$
$S_6$
$S_7$
$I_{1X}$
$I_{2X}$
$I_1$
$I_2$
A1
$R_{F1}$
$C_{F1}$
$R_{F2}$
$C_{F2}$
$I_P$
$I_N$
DAC
$D_1$
DSP
104
Φ1, Φ2, Φ3, Φ4, Φ5, Φ6 AND Φ7

504
V(V)
2.0
1.75
1.5
1.25
1.0
0.75
0.5
0.25
0.0
-0.25
-0.5
-0.75
-1.0
-1.25
-1.5
-1.75
-2.0
-2.25
TIME (us)
15.56
15.58
15.6
15.62
15.64
15.66
15.68
15.7
15.72
15.74
15.76
15.78
15.8
15.82
15.84

DUAL-MODE LINE DRIVER FOR ETHERNET APPLICATIONS

TECHNICAL FIELD

This description relates generally to line drivers, and more particularly to a dual-mode line driver for ethernet applications.

BACKGROUND

A line driver is an amplifier circuit commonly used for driving a load. A line driver may be coupled to a load by, for example, a cable, a transmission line or a circuit-board trace. A line driver transmits signals over a cable, a transmission line or a circuit-board trace to drive a load.

In ethernet applications, a line driver may be used to drive an ethernet device (e.g., computer, printer, router, modem or repeater). In industrial applications, the ethernet device may be a 10BASE-T, 100BASE-T or a 1000BASE-T device. Here, the terms “10BASE-T”, “100BASE-T” and “1000BASE-T” refer to IEEE standards that categorize ethernet devices depending on their transmission speed. A 10BASE-T-rated device transmits at 10 Megabits/s, a 100BASE-T-rated device transmits at 100 Megabits/s, and a 1000BASE-T-rated device transmit at 1000 Megabits/s. Thus, a line driver may be required to drive a 10BASE-T, a 100BASE-T or a 1000BASE-T device.

Because a 10BASE-T device generally requires a 3.5V peak-to-peak differential signal but a 100BASE-T device and a 1000BASE-T device generally require 2V peak-to-peak differential signal, in some industrial applications two line drivers are coupled in series. A first line driver (also referred to as a voltage-mode driver) provides a 2V peak-to-peak differential signal and a second line driver (also referred to as a current-mode driver) provides a 3.5V peak-to-peak differential signal. If the ethernet device is a 10BASE-T device, the current-mode driver provides a 3.5V differential signal, and, if the ethernet device is a 100BASE-T or a 1000BASE-T device, the voltage-mode driver provides a 2V peak-to-peak differential signal. However, implementing two line drivers in an integrated circuit or a semiconductor die requires more area. In some implementations, a current-mode driver converts a 2V differential signal from a voltage-mode driver to a 3.5V differential signal. Thus, regardless of the type of ethernet device, both the voltage-mode driver and the current-mode drivers may concurrently operate, thus increasing power consumption.

SUMMARY

In one aspect, a driver includes a first driver input, a second driver input, a first driver output and a second driver output. The driver includes an operational amplifier which includes a first amplifier input coupled to the first driver input, a second amplifier input coupled to the second driver input and includes a first amplifier output, a second amplifier output, a third amplifier output and a fourth amplifier output. The driver includes a first switch which includes a first terminal coupled to the first amplifier output and includes a second terminal. The driver includes a first resistor which includes a first terminal coupled to the second terminal of the first switch and a second terminal coupled to the first driver output. The driver includes a second switch which includes a first terminal coupled to the first amplifier output and includes a second terminal. The driver includes a second resistor which includes a first terminal coupled to the second terminal of the second switch and a second terminal coupled to the first driver output. The driver includes a third switch which includes a first terminal coupled to the third amplifier output and includes a second terminal. The driver includes a third resistor which includes a first terminal coupled to the second terminal of the third switch and a second terminal coupled to the second driver output. The driver includes a fourth switch which includes a first terminal coupled to the third amplifier output and includes a second terminal. The driver includes a fourth resistor which includes a first terminal coupled to the second terminal of the fourth switch and a second terminal coupled to the second driver output. The driver includes a fifth switch which includes a first terminal coupled to the first amplifier output and includes a second terminal. The driver includes a fifth resistor which includes a first terminal coupled to the second terminal of the fifth switch and a second terminal coupled to the third amplifier output. The driver includes a sixth switch which includes a first terminal coupled to the second amplifier output and a second terminal coupled to first driver output. The driver includes a seventh switch which includes a first terminal coupled to the fourth amplifier output and a second terminal coupled to the second driver output.

In an additional aspect, the first and the third resistor have equal resistance values and the second and the fourth resistor have equal resistance values.

In an additional aspect, the first switch is closed in a voltage-mode operation to couple the first amplifier output to the first driver output, and the second switch is closed in a current-mode operation to couple the first amplifier output to the first driver output.

In an additional aspect, the third switch is closed in a voltage mode operation to couple the third amplifier output to the second driver output, and the fourth switch is closed in a current-mode operation to couple the third amplifier output to the second driver output.

In an additional aspect, the fifth switch is closed in a current-mode operation to couple the fifth resistor across the first and the third amplifier outputs.

In an additional aspect, the sixth switch is closed in a current mode operation to couple the second amplifier output to the first driver output, and the seventh switch is closed in a current mode operation to couple the fourth amplifier output to the second driver output.

In an additional aspect, a dual-mode driver is configured for a voltage-mode operation and a current-mode operation. The driver includes a first driver input, a second driver input, a first driver output and a second driver output. The driver includes an operational amplifier which includes a first amplifier input coupled to the first driver input, a second amplifier input coupled to the second driver input. The driver includes a first voltage-mode amplifier output coupled to the first driver output via a first resistor in the voltage-mode operation and coupled to the first driver output via a second resistor in the current-mode operation. The driver includes a first current-mode amplifier output coupled to the first driver output in the current-mode operation. The driver includes a second voltage-mode amplifier output coupled to the second driver output via a third resistor in the voltage-mode operation and coupled to the second driver output via a fourth resistor in the current-mode operation. The driver includes a second current-mode amplifier output coupled to the second driver output in the current-mode operation.

In an additional aspect, a system includes a digital signal processor (DSP) which includes an input and an output. The system includes a digital-to-analog converter (DAC) which includes an input coupled to the output of the DSP and includes first and second outputs. The system includes a driver which includes a first driver input adapted to be coupled to the first output of the DSP, a second driver input adapted to be coupled to the second output of the DSP and includes a first driver output and a second driver output. The driver includes an operational amplifier which includes a first amplifier input coupled to the first driver input, a second amplifier input coupled to the second driver input and includes a first amplifier output, a second amplifier output, a third amplifier output and a fourth amplifier output. The driver includes a first switch which includes a first terminal coupled to the first amplifier output and includes a second terminal. The driver includes a first resistor which includes a first terminal coupled to the second terminal of the first switch and a second terminal coupled to the first driver output. The driver includes a second switch which includes a first terminal coupled to the first amplifier output and includes a second terminal.

The driver includes a second resistor which includes a first terminal coupled to the second terminal of the second switch and a second terminal coupled to the first driver output. The driver includes a third switch which includes a first terminal coupled to the third amplifier output and includes a second terminal. The driver includes a third resistor which includes a first terminal coupled to the second terminal of the third switch and a second terminal coupled to the second driver output. The driver includes a fourth switch which includes a first terminal coupled to the third amplifier output and includes a second terminal. The driver includes a fourth resistor which includes a first terminal coupled to the second terminal of the fourth switch and a second terminal coupled to the second driver output. The driver includes a fifth switch which includes a first terminal coupled to the first amplifier output and includes a second terminal. The driver includes a fifth resistor which includes a first terminal coupled to the second terminal of the fifth switch and a second terminal coupled to the third amplifier output. The driver includes a sixth switch which includes a first terminal coupled to the second amplifier output and a second terminal coupled to the first driver output. The driver includes a seventh switch which first terminal coupled to the fourth amplifier output and a second terminal coupled to the second driver output.

BRIEF DESCRIPTION OF THE DRAWINGS

The same reference numerals or other feature designators are used in the drawings to designate the same or similar (functionally and/or structurally) features.

DETAILED DESCRIPTION

Figure 1:
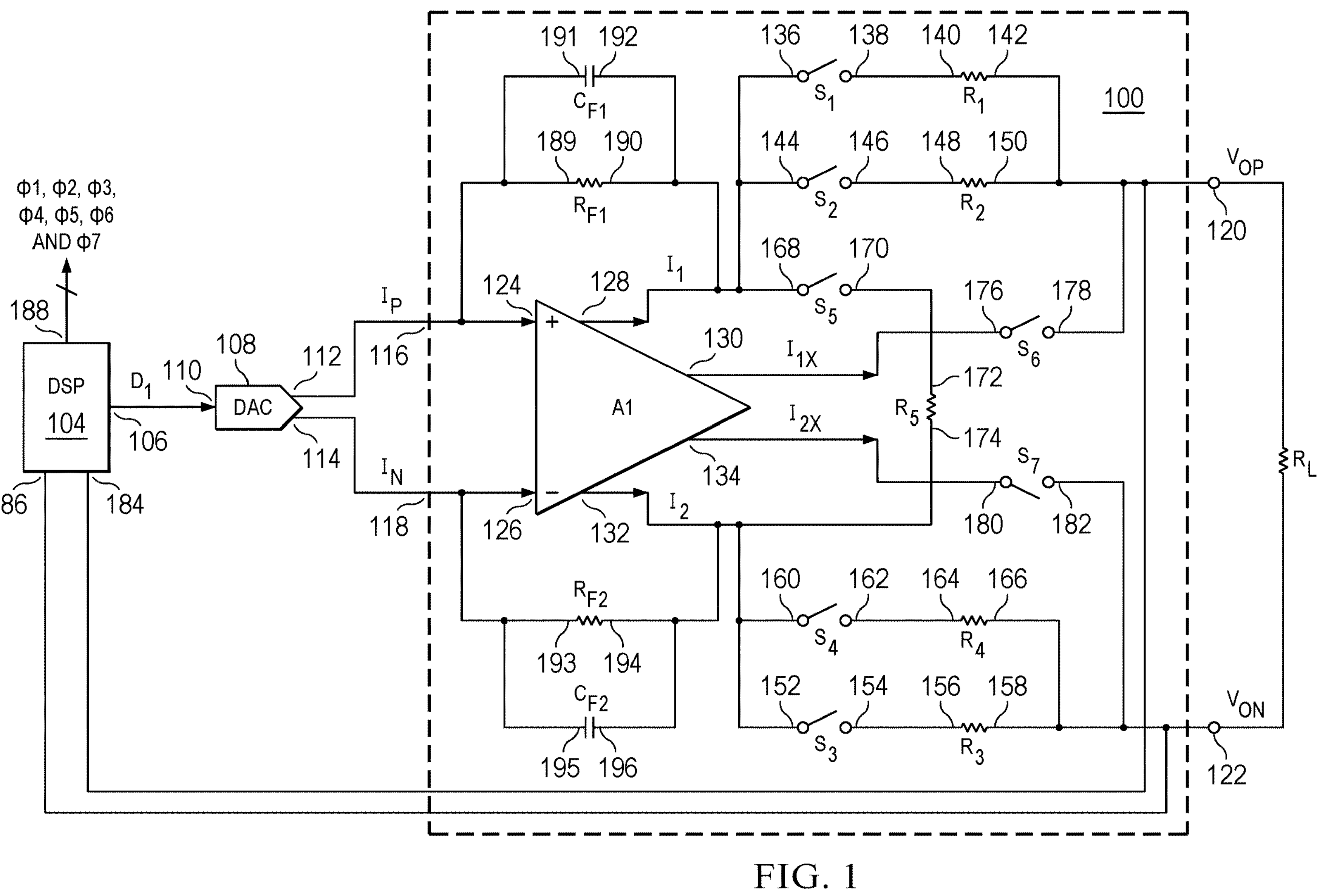
FIG. 1 is a block diagram illustrating a driver of an example embodiment.

FIG. 1 is a block diagram illustrating driver 100 of an example embodiment. Driver 100 is configured to operate in a voltage-mode and in a current-mode. In the voltage-mode, driver 100 provides a first differential output voltage, and, in a current-mode operation, driver 100 provides a second differential output voltage. The first differential output voltage (e.g., around 2V peak-to-peak) is less than the second differential output voltage (e.g., 3.5V peak-to-peak). Thus, in the current-mode, driver 100 provides a higher output voltage than in the voltage-mode. However, driver 100 consumes more power in the current-mode than in the voltage-mode. Driver 100 may be used, for example, in industrial applications, automotive applications and aerospace applications.

In some example embodiments, driver 100 operates in a current-mode to drive 10BASE-T-rated ethernet devices and operates in a voltage-mode to drive 100BASE-T-rated ethernet devices and 1000BASE-T-rated ethernet devices.

In some example embodiments, digital signal processor (DSP) 104 provides digital information $D_I$ (e.g., discrete-time and discrete-amplitude signals) at output 106. DSP 104 may be a microprocessor (or any other type of processor, controller or microcomputer) optimized for operational requirements of digital signal processing. DSP 104 may measure, filter, or compress analog signals and provide discrete-time and discrete-amplitude signals. Digital-to-analog converter (DAC) 108 receives digital information $D_I$ at input 110 and converts $D_I$ to a differential current signal which includes two complementary current signals $I_P$ and $I_N$ at respective outputs 112 and 114. Current signals $I_P$ and $I_N$ are balanced because they have equal magnitude and opposite polarity with respect to a common mode signal.

Driver 100 includes first driver input 116 coupled to output 112 of DAC 108 and includes second driver input 118 coupled to output 114 of DAC 108. Driver 100 includes first driver output 120 and second driver output 122. Driver 100 provides a differential output voltage which includes two complementary signals: voltage $V_{OP}$, which is provided at first driver output 120; and voltage $V_{ON}$, which is provided at second driver output 122. Voltages $V_{OP}$ and $V_{ON}$ are balanced because they have equal amplitude but opposite polarity with respect to a common-mode signal. Load resistor $R_L$ (e.g., around 100 ohms) may be coupled between driver outputs 120 and 124. Load resistor $R_L$ may represent an ethernet device (e.g., 10BASE-T, 100BASE-T or 1000BASE-T) or any other type of load.

Driver 100 includes operational amplifier $A_1$ which includes first amplifier input 124 (e.g., non-inverting input or a "+" input) coupled to first driver input 116 and includes second amplifier input 126 (e.g., an inverting input or a "−" input) coupled to second driver input 118. Operational amplifier $A_1$ includes four amplifier outputs: first amplifier output 128, second amplifier output 130, third amplifier output 132 and fourth amplifier output 134. First amplifier output 128 (may also be referred to as first voltage-mode amplifier output) and third amplifier output 132 (may also be referred to as second voltage-mode amplifier output) form a first differential output. Second amplifier output 130 (may also be referred to as first current-mode amplifier output) and fourth amplifier output 134 (may also be referred to as second current-mode amplifier output) form a second differential output.

First amplifier input 124 receives current signal $I_P$, and second amplifier input 126 receives current signal $I_N$. Operational amplifier $A_1$ provides output current $I_1$ at first amplifier output 128 and provides output current $I_{1X}$ at second amplifier output 130. Output current $I_{1X}$ is greater than output current $I_1$ by a factor of X (e.g., X can be any number, such as X=10, 15 or 20). Operational amplifier $A_1$ provides output current $I_2$ at third amplifier output 132 and provides output current $I_{2X}$ at fourth amplifier output 134. Output current $I_{2X}$ is greater than output current $I_2$ by a factor of X (e.g., X can be any number, such as X=10, 15 or 20).

Currents $I_1$ and $I_2$ are balanced because they have equal magnitude but opposite polarity with respect to a common-mode signal. Also, currents $I_{1X}$ and $I_{2X}$ are balanced because they have equal magnitude but opposite polarity with respect to a common-mode signal. In some example embodiments, output current $I_1$ is mirrored and amplified by $A_1$ to generate $I_{1X}$, and similarly output current $I_2$ is mirrored and amplified by $A_1$ to generate $I_{2X}$.

Driver 100 includes first switch $S_1$ which includes first terminal 136 coupled to first amplifier output 128 and includes second terminal 138. Driver 100 includes first resistor $R_1$ (e.g., approximately 50 ohms) which includes first terminal 140 coupled to second terminal 138 of first switch $S_1$ and includes second terminal 142 coupled to first driver output 120.

Driver 100 includes second switch $S_2$ which includes first terminal 144 coupled to first amplifier output 128 and includes second terminal 146. Driver 100 includes second resistor $R_2$ which includes first terminal 148 coupled to second terminal 146 of second switch $S_2$ and includes second terminal 150 coupled to first driver output 120.

Driver 100 includes third switch S3 which includes first terminal 152 coupled to third amplifier output 132 and includes second terminal 154. Driver 100 includes third resistor $R_3$ (e.g., approximately 50 ohms) which includes first terminal 156 coupled to second terminal 154 of third switch $S_3$ and second terminal 158 coupled to second driver output 122.

Driver 100 includes fourth switch $S_4$ which includes first terminal 160 coupled to third amplifier output 132 and includes second terminal 162. Driver 100 includes fourth resistor $R_4$ which includes first terminal 164 coupled to second terminal 162 of fourth switch $S_4$ and second terminal 166 coupled to second driver output 122.

Driver 100 includes fifth switch $S_5$ which includes first terminal 168 coupled to first amplifier output 128 and includes second terminal 170. Driver 100 includes fifth resistor $R_5$ which includes first terminal 172 coupled to second terminal 170 of fifth switch $S_5$ and second terminal 174 coupled to third amplifier output 132.

Driver 100 includes sixth switch S6 which includes first terminal 176 coupled to second amplifier output 130 and second terminal 178 coupled to first driver output 120. Driver 100 includes seventh switch $S_7$ which includes first terminal 180 coupled to fourth amplifier output 134 and second terminal 182 coupled to second driver output 122.

In some example embodiments, $R_2$ may be expressed by the algebraic equation: $R_2=(X+1)R_1/2$, where $R_L$ is the load resistor and X is the ratio between $I_{1X}$ and $I_1$ (or the ratio between $I_{2X}$ and $I_2$). Similarly, $R_4$ may be expressed by the algebraic equation: $(X+1)R_1/2$. For example, if X=10 and $R_L$=100 ohms, then $R_2=R_4$=550 ohms.

In some example embodiments, DSP 104 provides timing signals $\Phi_1$, $\Phi_2$, $\Phi_3$, $\Phi_4$, $\Phi_5$, $\Phi_6$ and $\Phi_7$ which control respective switches $S_1$, $S_2$, $S_3$, $S_4$, $S_5$, $S_6$ and $S_7$. DSP 104 includes differential inputs 184 and 186 coupled to respective first and second driver outputs 120 and 122. DSP 104 identifies the ethernet device (e.g., $R_L$) coupled to driver outputs 120 and 122 as a 10BASE-T, a 100BASE-T or a 1000BASE-T device. Based on this identification, DSP 104 provides timing signals $\Phi_1$, $\Phi_2$, $\Phi_3$, $\Phi_4$, $\Phi_5$, $\Phi_6$ and $\Phi_7$ to switches $S_1$, $S_2$, $S_3$, $S_4$, $S_5$, $S_6$ and $S_7$, respectively at output 188.

In some example embodiments, if a timing signal (e.g., $\Phi_1$ or $\Phi_2$) is asserted HIGH, the corresponding switch (e.g., $S_1$ or $S_2$) is closed, and as a result current may conduct through the switch. Conversely, if a timing signal (e.g., $\Phi_1$ or $\Phi_2$) is asserted LOW, the corresponding switch (e.g., $S_1$ or $S_2$) is opened, and as a result the switch prevents current from conducting.

Driver 100 includes first feedback resistor $R_{F1}$ (e.g., around 10K ohms) which includes first terminal 189 coupled to first amplifier input 124 of $A_1$ and includes second terminal 190 coupled to first amplifier output 128 of $A_1$. Driver 100 includes first feedback capacitor $C_{F1}$ (e.g., around 350 pico-farads) which includes first terminal 191 coupled to first amplifier input 124 of $A_1$ and includes second terminal 192 coupled to first amplifier output 128 of $A_1$. Driver 100 includes second feedback resistor $R_{F2}$ (e.g., around 10K ohms) which includes first terminal 193 coupled to second amplifier input 126 of $A_1$ and includes second terminal 194 coupled to third amplifier output 132 of $A_1$. Driver 100 includes second feedback capacitor $C_{F2}$ (e.g., around 350 pico-farads) which includes first terminal 195 coupled to second amplifier input 126 of $A_1$ and includes second terminal 196 coupled to third amplifier output 132 of $A_1$.

Feedback resistors $R_{F1}$ and $R_{F2}$ and feedback capacitors $C_{F1}$ and $C_{F2}$ set a gain and a bandwidth of operational amplifier $A_1$. At low frequencies, $C_{F1}$ and $C_{F2}$ act as open circuits (e.g., $C_{F1}$ and $C_{F2}$ have high impedances) and thus at low frequencies the gain of $A_1$ is set by $R_{F1}$ and $R_{F2}$. As the frequency rises, the impedances of $C_{F1}$ and $C_{F2}$ fall, thereby lowering the effective impedance of parallel-connected $R_{F1}$ and $C_{F1}$ and the effective impedance of parallel-connected $R_{F2}$ and $C_{F2}$. Thus, as the frequency rises the gain of $A_1$ begins to decrease. At a high frequency, $C_{F1}$ and $C_{F2}$ act as short circuits (e.g., $C_{F1}$ and $C_{F2}$ have very low impedances) and as such the gain of $A_1$ drops to near zero.

Figure 2:
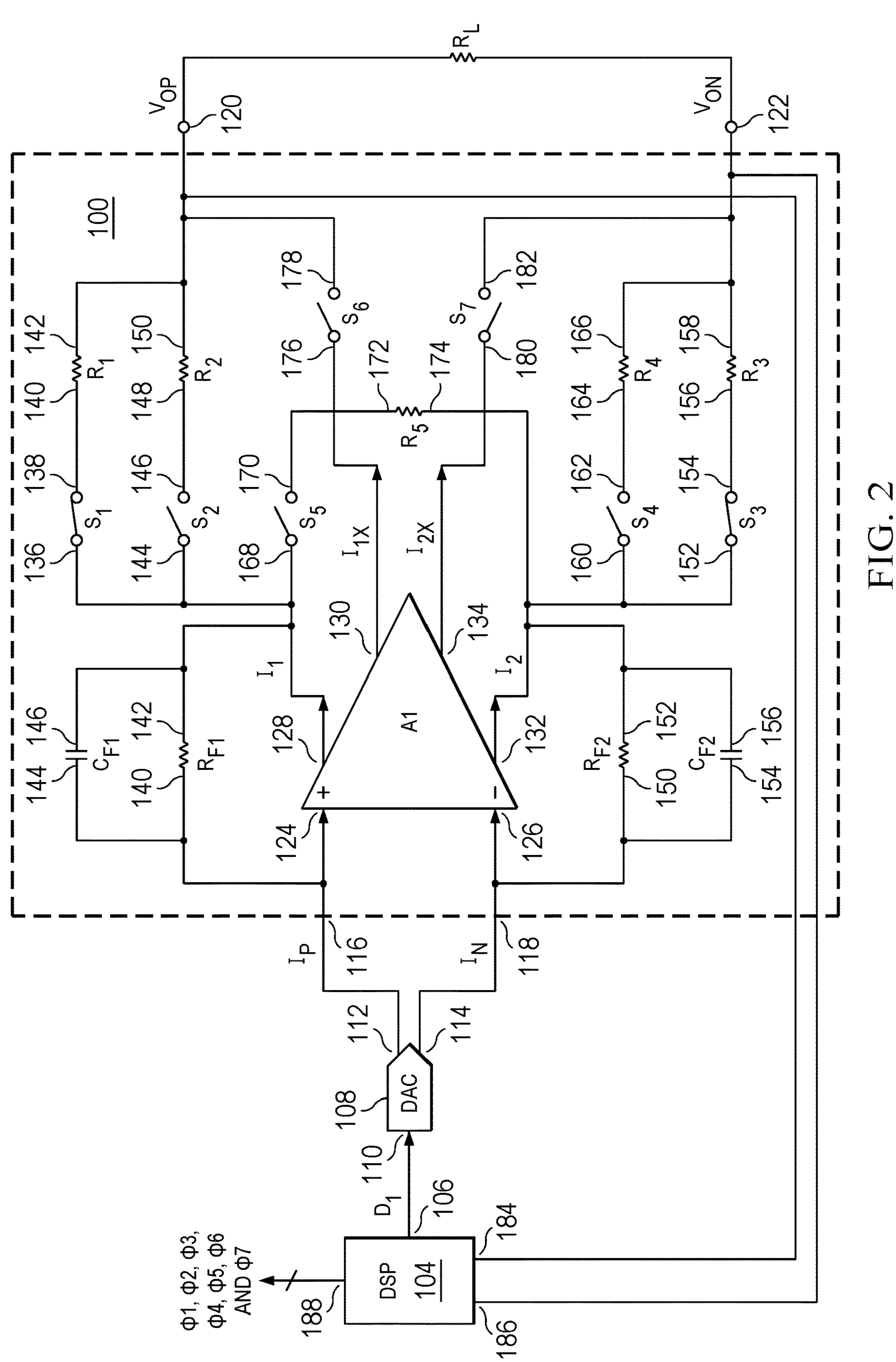
FIG. 2 is a block diagram illustrating a voltage-mode operation of the driver of FIG. 1.

FIG. 2 is a block diagram illustrating a voltage-mode operation of driver 100. In the voltage-mode, switches $S_1$ and $S_3$ are closed but switches $S_2$, $S_4$, $S_5$, $S_6$ and $S_7$ are opened. Thus, resistor $R_1$ is coupled between first amplifier output 128 and first driver output 120, and resistor $R_3$ is coupled between third amplifier output 132 and second driver output 122. Resistor $R_2$ is disconnected from first amplifier output 128, resistor $R_4$ is disconnected from third amplifier output 132 and resistor $R_5$ is disconnected from first and third amplifier outputs 128 and 132, respectively. Also, second amplifier output 130 is disconnected from first driver output 120, and fourth amplifier output 134 is disconnected from second driver output 122. As a result, current $I_1$ from first amplifier output 128 conducts through resistor $R_1$ and then through load $R_L$. Similarly, current $I_2$ from third amplifier output 132 conducts through resistor $R_3$ and then through load $R_L$. Currents $I_1$ and $I_2$ are balanced because they have equal magnitude and opposite polarity with respect to a common-mode signal. Load $R_L$ represents an ethernet device (e.g., computer, printer, router, modem, repeater or gateway) or any other load. Thus, in the voltage-mode, two complementary signals, current $I_1$ and current $I_2$, drive load $R_L$. Since $S_6$ and $S_7$ are opened, no current flows from second and fourth amplifier outputs 130 and 134.

In the voltage-mode, currents $I_1$ and $I_2$ produce a differential voltage (e.g., around 2V peak-to-peak) between first and second driver outputs 120 and 122. The differential voltage (e.g., around 2V peak-to-peak) includes two complementary signals: voltage $V_{OP}$ which is produced at first driver output 120; and voltage $V_{ON}$ which is produced at second driver output 122. The differential voltage is applied to load $R_L$. Because resistors $R_1$ (e.g., around 50 ohms) and $R_2$ (e.g., around 50 ohms) are connected in series with load $R_L$ (e.g., around 100 ohms), the total impedance of the series connected $R_1$ and $R_2$ matches the impedance of $R_L$. Thus, $R_1$ and $R_2$ act as terminating resistors which maximize power delivery to $R_L$ and minimize reflected signals from $R_L$.

Figure 3:
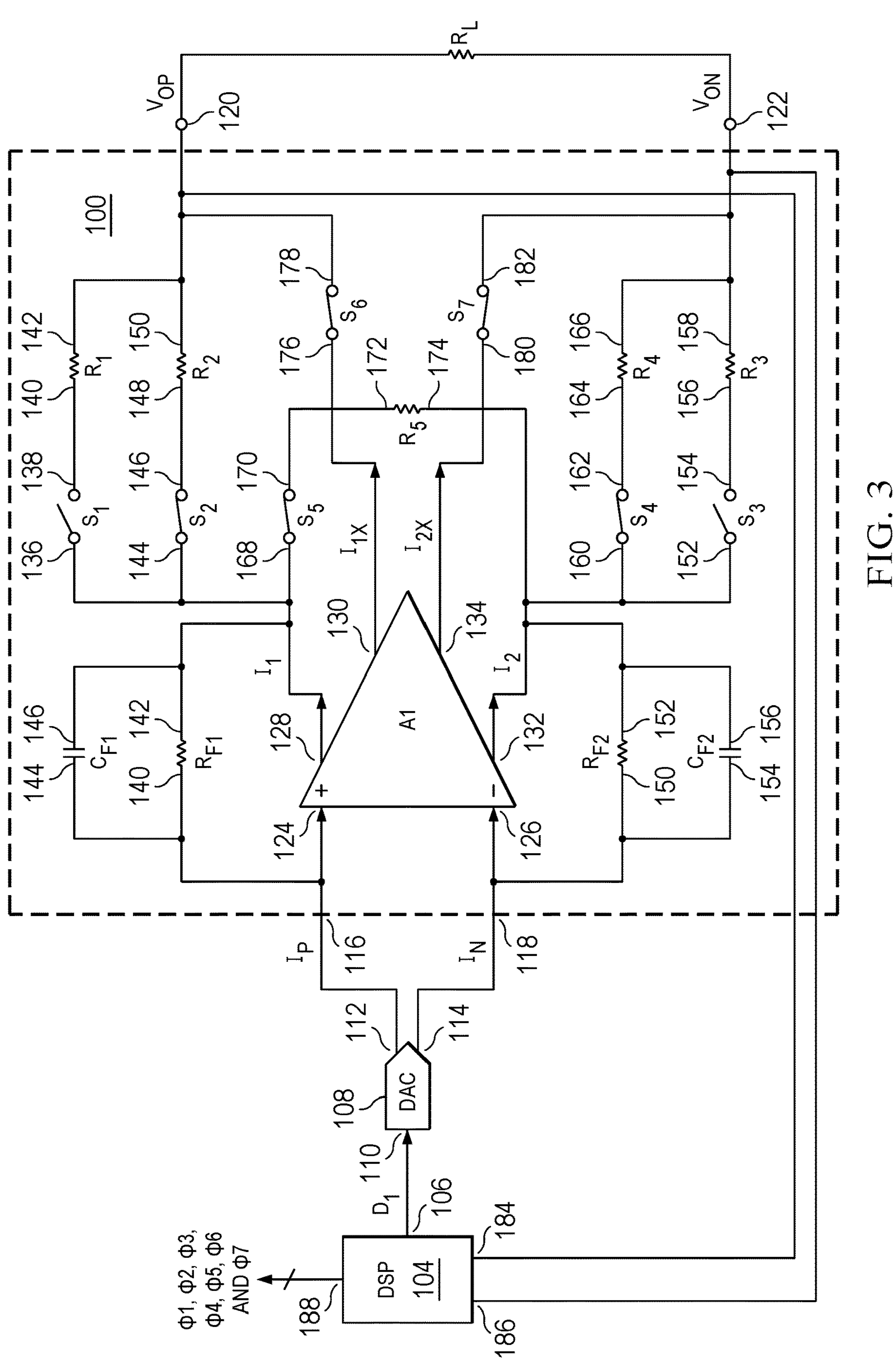
FIG. 3 is a block diagram illustrating a current-mode operation of the driver of FIG. 1.

FIG. 3 is a block diagram illustrating a current-mode operation of driver 100. In the current-mode, switches $S_1$ and $S_3$ are opened but switches $S_2$, $S_4$, $S_5$, $S_6$ and $S_7$ are closed. Thus, resistor $R_2$ is coupled between first amplifier output 128 and first driver output 120 and resistor $R_4$ is coupled between third amplifier output 132 and second driver output. Resistor $R_1$ is disconnected from first amplifier output 128, and resistor $R_3$ is disconnected from third amplifier output 132.

Resistor $R_5$ is coupled between first and third amplifier outputs 128 and 132. Also, second amplifier output 130 is coupled to first driver output 120, and fourth amplifier output 134 is coupled to second driver output 122.

In the current-mode, current $I_{1X}$ from second amplifier output 130 conducts through load $R_L$ and current $I_{2X}$ from fourth amplifier output 134 conducts through load $R_L$. Currents $I_{1X}$ and $I_{2X}$ are balanced because they have equal magnitude and opposite polarity with respect to a common-mode signal. Thus, in the current-mode, two complementary signals, current $I_{1X}$ and current $I_{2X}$, drive load $R_L$.

Since $S_2$ and $S_4$ are closed in the current mode, resistors $R_2$ and $R_4$ set "looking in impedances" $R_O$ of driver 100. Here, "looking in impedances" $R_O$ refer to an impedance measured at first driver output 120 when looking into driver 100 and an impedance measured at second driver output 122 when looking into driver 100. In some example embodiments, the looking in impedance $R_O$ may be approximated by equation (1):

$$R_O = R_2/(1+X) = R_4/(1+X), \tag{1}$$

where X is the ratio between $I_{1X}$ and $I_1$ or the ratio between $I_{2X}$ and $I_2$, and $R_2=R_4$.

By substituting $R_2=R_4=(X+1)R_1/2$, $R_O$ may be expressed by equation (2):

$$R_O = R_1/2 \tag{2}$$

Thus, the looking in impedance $R_O=R_L/2$ at first driver output 120 and the looking in impedance $R_O=R_L/2$ at second driver output 120 act as terminating impedances with respect to load $R_L$, thereby maximizing power delivery to $R_L$ and minimizing reflected signals from $R_L$.

Figure 4:
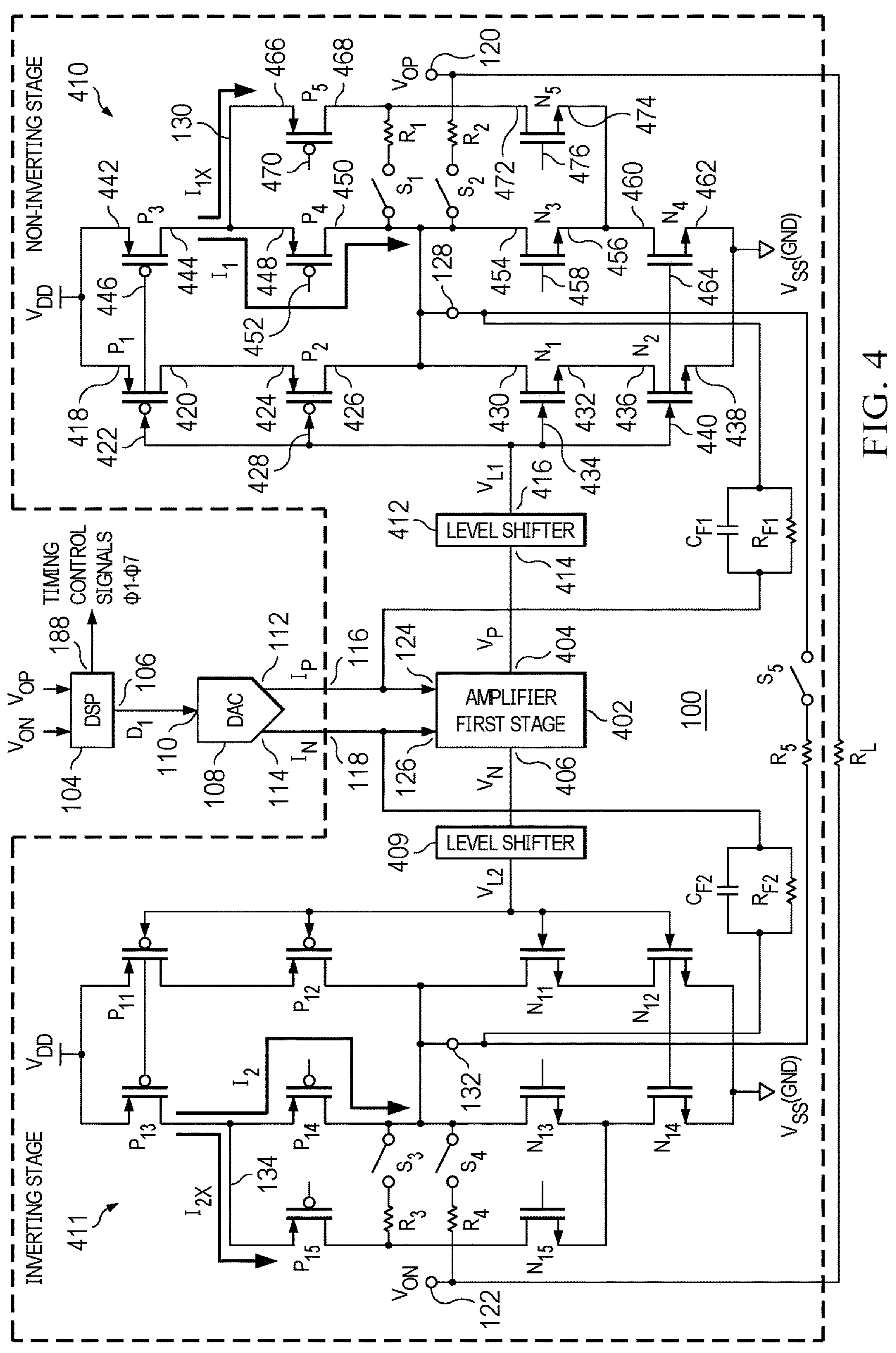
FIG. 4 is a schematic diagram illustrating an implementation of the driver.

FIG. 4 is a schematic diagram illustrating an example implementation of driver 100 of an example embodiment. Driver 100 includes first and second driver inputs 116 and 118 and includes first and second driver outputs 120 and 122. Driver 100 provides a differential voltage signal at driver outputs 120 and 122. The differential voltage signal comprises two complementary signals: voltage $V_{OP}$ which is provided at first driver output 120; and voltage $V_{ON}$ which is provided at second driver output 122. Driver 100 is configured to drive load $R_L$ which may be coupled between driver outputs 120 and 122. Load $R_L$ may, for example, be a 10BASE-T, a 100BASE-T or a 1000BASE-T ethernet device.

DSP 104 provides digital information $D_I$ at output 106. DAC 108 receives digital information $D_I$ at input 110 and converts $D_I$ to a differential current signal. The differential current signal includes two complementary current signals: current $I_P$ which is provided at output 112 of DAC 108 and current $I_N$ which is provided at output 114 of DAC 108. Driver input 116 is coupled to output 112 of DAC 108, and driver input 118 is coupled to output 114 of DAC 108.

Driver 100 includes first stage amplifier 402 which includes first amplifier input 124 coupled to first driver input 116 and includes second amplifier input 126 coupled to second driver input 118. First stage amplifier 402 receives the differential current signal comprising currents $I_P$ and $I_N$ and performs a current-to-voltage conversion and provides complementary voltages $V_P$ and $V_N$ at respective outputs 404 and 406.

Driver 100 includes non-inverting stage 410 and inverting stage 411 that may have identical configurations. Non-inverting stage 410 includes level shifter 412 which includes input 414 coupled to output 404 of first stage amplifier 402. Level shifter 412 receives voltage $V_P$ and shifts up the voltage level of $V_P$ to a higher voltage that may be necessary to drive transistors (e.g., PMOS transistors and NMOS transistors) and provides level-shifted voltage $V_{L1}$ at output 416.

Non-inverting stage 410 includes transistor $P_1$(e.g., PMOS transistor) which includes first current terminal 418 (e.g., source) adapted to receive voltage supply $V_{DD}$ (e.g., around 3.3V). Transistor $P_1$ includes second current terminal 420 (e.g., drain) and includes control terminal 422 (e.g., gate) coupled to receive level-shifted voltage $V_{L1}$. Non-inverting stage 410 includes transistor $P_2$ (e.g., PMOS transistor) which includes first current terminal 424 (e.g., source) coupled to second current terminal 420 of transistor $P_1$. Transistor $P_2$ includes second current terminal 426 (e.g., drain) and includes control terminal 428 (e.g., gate) coupled to receive voltage $V_{L1}$.

Non-inverting stage 410 includes transistor $N_1$ (e.g., NMOS transistor) which includes first current terminal 430 (e.g., drain) coupled to second current terminal 426 of transistor $P_1$. Transistor $N_1$ includes second current terminal 432 (e.g., source) and includes control terminal 434 (e.g., gate) coupled to receive voltage $V_{L1}$. Non-inverting stage 410 includes transistor $N_2$ (e.g., NMOS transistor) which includes first current terminal 436 (e.g., drain) coupled to second current terminal 432 of transistor $N_1$, second current terminal 438 (e.g., source) adapted to be coupled to common potential $V_{SS}$ (e.g., ground) and control terminal 440 (e.g., gate) coupled to receive voltage $V_{L1}$.

Non-inverting stage 410 includes transistor $P_3$ (e.g., PMOS transistor) which includes first current terminal 442 (e.g., source) adapted to receive voltage supply $V_{DD}$. Transistor $P_3$ includes second current terminal 444 (e.g., drain) and includes control terminal 446 (e.g., gate) coupled to receive voltage $V_{L1}$. Non-inverting stage 410 includes transistor $P_4$ (e.g., PMOS transistor) which includes first current terminal 448 (e.g., source) coupled to second terminal 444 of $P_3$. Transistor $P_4$ includes second current terminal 450 (e.g., drain) and includes control terminal 452 (e.g., gate) coupled to receive control signal $\Phi_1$ from DSP 104. In some example embodiments, because control signal $\Phi_1$ is generated by DSP 104, a gate drive circuit (not shown in FIG. 4) may additionally be used to amplify or boost control signal $\Phi_1$ prior to applying $\Phi_1$ to control terminal 452 of transistor $P_4$ so that control signal $\Phi_1$ has the necessary potential/voltage and current levels required to drive transistor $P_4$.

Non-inverting stage 410 includes transistor $N_3$ (e.g., NMOS transistor) which includes first current terminal 454 (e.g., drain) coupled to second current terminal 450 of transistor $P_4$ and includes second current terminal 456 (e.g., source). Transistor $N_3$ includes control terminal 458 (e.g., gate) coupled to receive control signal $\Phi_1$ from DSP 104. In some example embodiments, a gate drive circuit (not shown in FIG. 4) may additionally be used to amplify or boost control signal $\Phi_1$ prior to applying $\Phi_1$ to control terminal 458 of transistor $N_3$ so that control signal $\Phi_1$ has the necessary potential/voltage and current required to drive transistor $N_3$. Non-inverting stage 410 includes transistor $N_4$ (e.g., NMOS transistor) which includes first current terminal 460 (e.g., drain) coupled to second current terminal 456 of transistor $N_3$, second current terminal 462 (e.g., source) adapted to be coupled to common potential $V_{SS}$ and control terminal 464 (e.g., gate) coupled to receive voltage $V_{L1}$.

Non-inverting stage 410 includes transistor $P_5$(e.g., PMOS transistor) which includes first current terminal 466 (e.g., source) adapted to receive voltage supply $V_{DD}$ and includes second current terminal 468. Transistor $P_5$ includes control terminal 470 (e.g., gate) coupled to receive control signal $\Phi_6$ from DSP 104. In some example embodiments, a gate drive circuit (not shown in FIG. 4) may be used to amplify or boost control signal $\Phi_6$ prior to applying $\Phi_6$ to control terminal 470 of transistor $P_5$ so that control signal $\Phi_6$ has the necessary potential/voltage and current required to drive transistor $P_5$. Non-inverting stage 410 includes transistor $N_5$(e.g., NMOS transistor) which includes first current terminal 472 (e.g., drain) coupled to second current terminal 468 of transistor $P_5$ and includes second current terminal 474 (e.g., source) coupled to second current terminal 456 of $N_3$ and also coupled to first current terminal 460 of transistor $N_4$. Transistor $N_5$ includes control terminal 476 (e.g., gate) coupled to receive control signal $\Phi_6$. A gate drive circuit (not shown in FIG. 4) may be used to amplify or boost control signal $\Phi_6$ prior to applying $\Phi_6$ to control terminal 476 of $N_5$.

In non-inverting stage 410, second current terminal 426 of transistor $P_2$ and second current terminal 450 of transistor $P_4$ are coupled to first amplifier output 128. Similarly, first current terminal 430 of transistor $N_1$ and first current terminal 454 of transistor $N_3$ are coupled to first amplifier output 128.

Non-inverting stage 410 includes first switch $S_1$ and resistor $R_1$ which are connected in series between first amplifier output 128 and first driver output 120. Non-inverting stage 410 includes second switch $S_2$ and resistor $R_2$ which are connected in series between first amplifier output 128 and first driver output 120.

Non-inverting stage includes feedback resistor $R_{F1}$ and feedback capacitor $C_{F1}$ coupled in parallel between first amplifier input 124 and first amplifier output 128. Fifth switch $S_5$ and resistor $R_5$ (e.g., $R_5=X*R_L$) are coupled in series between first amplifier output 128 and third amplifier output 132 of inverting stage 412.

Inverting stage 411 includes level shifter 409 and also includes transistors $P_{11}$, $P_{12}$, $P_{13}$, $P_{14}$, $N_{11}$, $N_{12}$, $N_{13}$, $N_{14}$, $P_{51}$ and $N_{15}$. Inverting stage 412 includes resistors $R_3$, $R_4$, $R_{F2}$, capacitor $C_{F2}$ and switches $S_3$ and $S_4$. Inverting stage 412 includes second amplifier output 132 and second driver output 122. Inverting stage 411 is configured in the same way as non-inverting stage 410.

In voltage-mode, transistors $P_4$ and $N_3$ are enabled (e.g., $P_4$ and $N_3$ are turned ON; conducting) but transistors $P_5$ and $N_5$ are not enabled (e.g., $P_5$ and $N_5$ are turned OFF; non-conducting). For example, transistors $P_4$ and $N_3$ may be controlled (e.g., turned ON/OFF) by control signal Φ1, and transistors $P_5$ and $N_5$ may be controlled (e.g., turned ON/OFF) by control signal Φ6. Also, in voltage-mode switch $S_1$ is closed but switch $S_2$ and $S_5$ are opened. Switch $S_1$ may be controlled (e.g., opened/closed) by control signal Φ1, switch $S_2$ may be controlled (e.g., opened/controlled) by control signal Φ2, and switch $S_5$ may be controlled (e.g., opened/closed) by control signal Φ5.

Depending on the polarity of the differential signal (e.g., polarity of voltages $V_P$ and $V_N$) provided by first amplifier stage 402, output voltage $V_{L1}$ of level shifter 412 may either be LOW or HIGH. If voltage $V_{L1}$ is LOW, transistors $P_1$, $P_2$ and $P_3$ are turned ON but transistors $N_1$, $N_2$ and $N_4$ are turned OFF. Thus, current from voltage supply $V_{DD}$ conducts through transistors $P_1$, $P_2$, then through resistor $R_1$, and out of first driver output 120 and then through load $R_L$. Also, current from voltage supply $V_{DD}$ conducts through transistors $P_3$, $P_4$, then through resistor $R_1$, and out of first driver output 120 and then through load $R_L$. Because first current terminal 418 of $P_1$ is coupled to first current terminal 442 of $P_3$, and control terminal 422 of $P_1$ is coupled to control terminal 446 of $P_3$, transistors $P_1$ and $P_3$ essentially act as a single transistor. Thus, in the voltage-mode if $V_{L1}$ is LOW, current conducts through two conduction paths (a conduction path which includes $P_1$, $P_2$, $S_1$ and $R_L$, and another conduction path which includes $P_3$, $P_4$, $R_1$ and $R_L$). Because switches $S_2$ and $S_5$ are opened in the voltage-mode, no current conducts through resistor $R_2$ or through resistor $R_5$ (e.g., $R_5=X*R_L$).

In the voltage-mode, if voltage $V_{L1}$ is HIGH, transistors $P_1$, $P_2$ and $P_3$ are turned OFF but transistors $N_1$, $N_2$ and $N_4$ are turned ON. Thus, current through load $R_L$ conducts in the reverse direction out of first driver output 120, then through transistors $N_3$ and $N_4$ and then flows to common potential $V_{SS}$. Also, current through load $R_L$ conducts in the reverse direction out of first driver output 120, then through transistors $N_1$ and $N_2$ and then flows to common potential $V_{SS}$. Because control terminal 440 of $N_2$ is coupled to control terminal 464 of $N_4$ and second current terminal 438 of $N_2$ is coupled to second current terminal 462 of $N_4$, $N_2$ and $N_4$ act as a single transistor. Thus, in the voltage-mode if $V_{L1}$ is HIGH, current conducts through two conduction paths (a conduction path which includes $R_L$, $R_1$, $N_3$ and $N_4$, and another conduction path which includes $R_L$, $R_1$, $N_1$ and $N_2$).

In the current-mode, transistors $P_5$ and $N_5$ are enabled (e.g., $P_5$ and $N_5$ are turned ON) but transistors $P_4$ and $N_3$ are not enabled (e.g., $P_4$ and $N_3$ are turned OFF). Also, in the current-mode, switch $S_1$ is opened but switches $S_2$ and $S_5$ are closed. If output voltage $V_{L1}$ of level shifter 412 is LOW, transistors $P_1$, $P_2$ and $P_3$ are turned ON but transistors $N_1$, $N_2$ and $N_4$ are turned OFF. Thus, current from voltage supply $V_{DD}$ conducts through transistors $P_3$ and $P_5$, then out of first driver output 120 and through load $R_L$. In the current-mode, substantially all load current flows through the conduction path which includes $P_3$, $P_5$ and $R_L$. Although in the current-mode transistors $P_1$ and $P_2$ are turned ON, near zero DC current conducts through $P_1$ and $P_2$. Thus, near zero DC current conducts through resistor $R_2$, and, as such, voltage across $R_2$ is approximately zero. Because switch $S_5$ is closed in the current-mode, resistor $R_5$ is coupled between first amplifier output 128 and second amplifier output 132. Also, because the voltage across resistor $R_2$ is approximately zero, $R_5$ is effectively coupled in parallel with load $R_L$. As such, driver 100 essentially acts as a current source.

In the current-mode, if output voltage $V_{L1}$ of level shifter 412 is HIGH, transistors $P_1$, $P_2$ and $P_3$ are turned OFF but transistors $N_1$, $N_2$ and $N_4$ are turned ON. Because $N_5$ is also turned ON, current through load $R_L$ conducts in the reverse direction out of first driver output 120, then through transistors $N_5$ and $N_4$ and then into common potential $V_{SS}$. In the current-mode, if $V_{L1}$ is HIGH, substantially all load current flows through a conduction path comprising $R_L$, $N_5$ and $N_4$. Although in the current mode, switch $S_2$ is closed and transistors $N_1$ and $N_2$ are turned ON, near zero current flows through transistors $N_1$ and $N_2$. Thus, near zero current flows through resistor $R_2$, and thus voltage across $R_2$ is approximately zero.

The operations of inverting stage 412 in the voltage-mode and in the current-mode are similar to the operations of non-inverting stage 410 in the voltage-mode and in the current mode.

Figure 5:
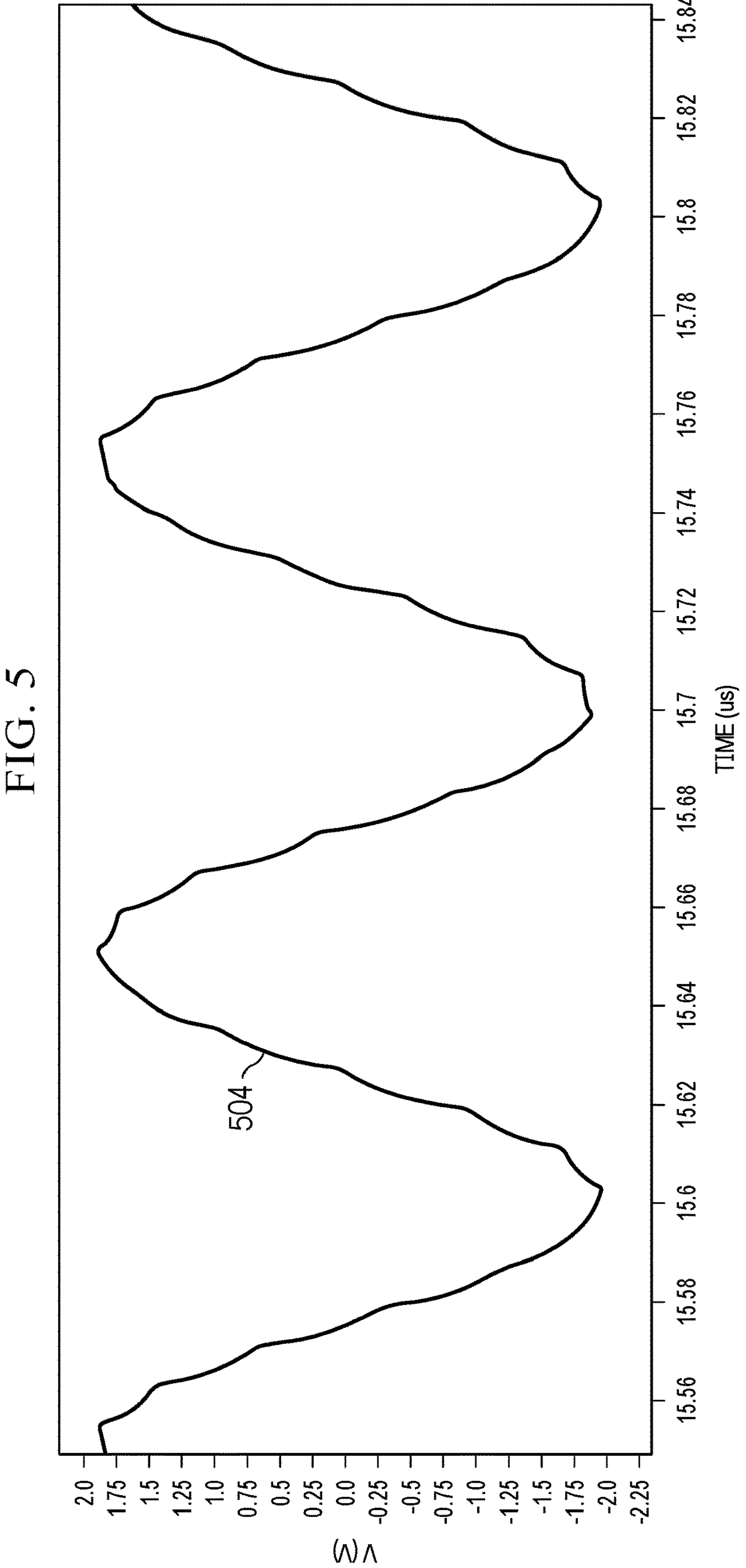
FIG. 5 is a simulated waveform of an output voltage in a current-mode operation.

FIG. 5 is a graph (indicated by reference number 504) of a simulated differential output voltage ($V_{OP}-V_{ON}$) versus time when driver 100 operates in the current-mode. Driver 100 provides around 3.9V peak-to-peak differential voltage.

Figure 6:
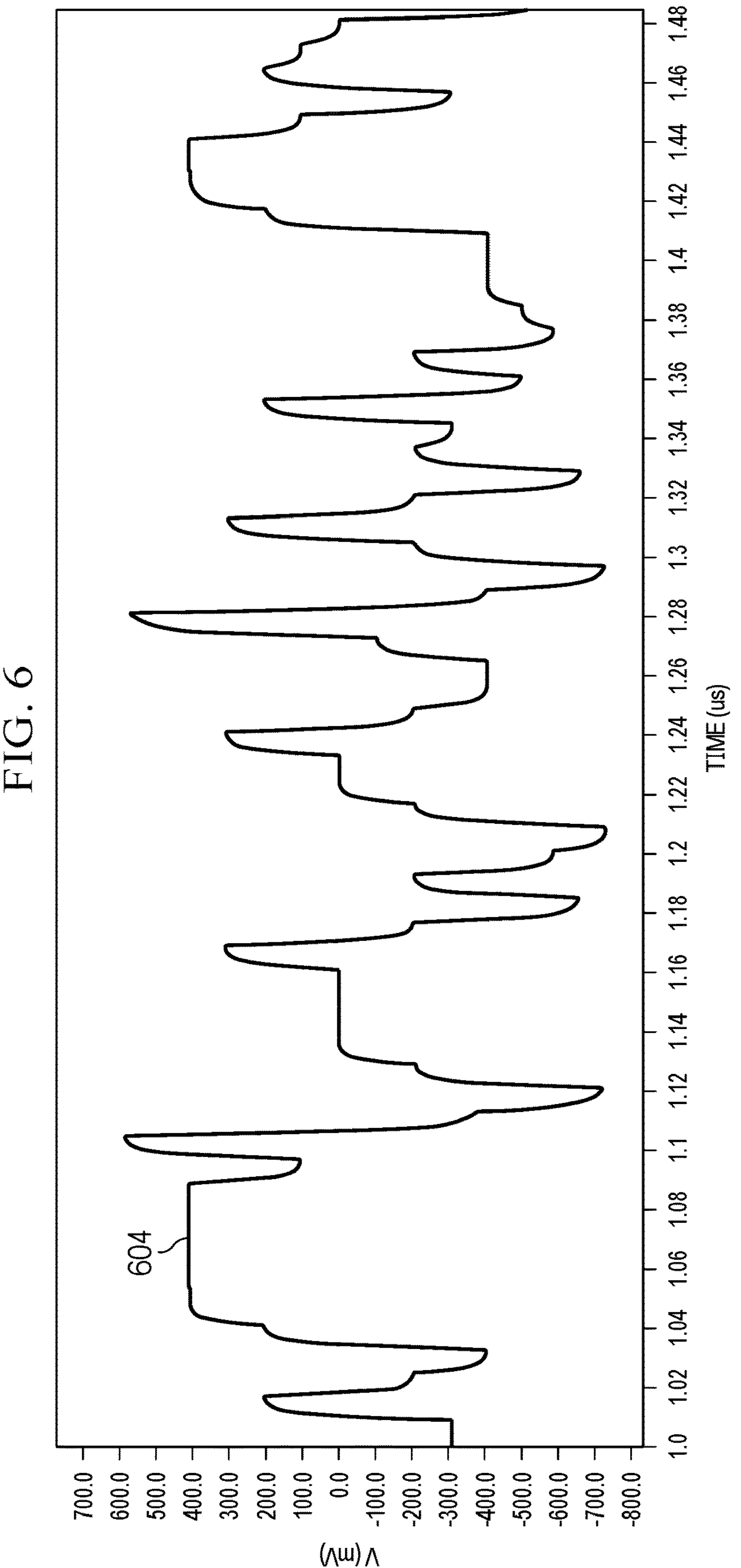
FIG. 6 is a simulated waveform of an output voltage in a voltage-mode operation.

FIG. 6 is a graph (indicated by reference number 604) of a simulated differential output voltage ($V_{OP}-V_{ON}$) versus time when driver 100 operates in the voltage-mode. Driver 100 provides around 2V peak-to-peak differential voltage.

The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronic or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While the use of particular transistors are described herein, other transistors (or equivalent devices) may be used instead with little or no change to the remaining circuitry. For example, a metal-oxide-silicon FET (MOSFET) (e.g., an n-channel MOSFET or a p-channel MOSFET), a bipolar junction transistor (BJT) (e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value, or, if the value is zero, a reasonable range of values around zero. Modifications are possible in the described examples, and other examples are possible within the scope of the claims.

What is claimed is:

1. A driver comprising:
a first driver input;
a second driver input;
a first driver output;
a second driver output;
an operational amplifier comprising:
a first amplifier input coupled to the first driver input;
a second amplifier input coupled to the second driver input;
a first amplifier output;
a second amplifier output;
a third amplifier output;
a fourth amplifier output, wherein output current supplied by the second amplifier output and the fourth amplifier output is greater than output current supplied by the first amplifier output and the third amplifier output;
a first resistor;
a first switch to selectively couple the first amplifier output to the first driver output via the first resistor;
a second resistor;
a second switch to selectively couple the first amplifier output to the first driver output via the second resistor;
a third resistor;
a third switch to selectively couple the third amplifier output to the second driver output via the third resistor;
a fourth resistor;
a fourth switch to selectively couple the third amplifier output to the second driver output via the fourth resistor;
a fifth resistor;
a fifth switch to selectively couple the first amplifier output to the third amplifier output via the fifth resistor;
a sixth switch to selectively couple the second amplifier output to the first driver output; and
a seventh switch to selectively couple the fourth amplifier output to the second driver output.

2. The driver of claim 1, wherein the first and the third resistor have equal resistance values.

3. The driver of claim 1, wherein the second and the fourth resistor have equal resistance values.

4. The driver of claim 1, wherein the first switch is closed in a voltage-mode operation to couple the first amplifier output to the first driver output, and wherein the second switch is closed in a current-mode operation to couple the first amplifier output to the first driver output.

5. The driver of claim 1, wherein the third switch is closed in a voltage mode operation to couple the third amplifier output to the second driver output, and wherein the fourth switch is closed in a current-mode operation to couple the third amplifier output to the second driver output.

6. The driver of claim 1, wherein the fifth switch is closed in a current-mode operation to couple the fifth resistor across the first and the third amplifier outputs.

7. The driver of claim 1, wherein the sixth switch is closed in a current mode operation to couple the second amplifier output to the first driver output, and wherein the seventh switch is closed in the current mode operation to couple the fourth amplifier output to the second driver output.

8. A driver comprising:
a first driver input;
a second driver input;
a first driver output;
a second driver output; and
an operational amplifier comprising:
a first amplifier input coupled to the first driver input;
a second amplifier input coupled to the second driver input;
a first voltage-mode amplifier output coupled to the first driver output via a first resistor in a voltage-mode operation and coupled to the first driver output via a second resistor in a current-mode operation;
a first current-mode amplifier output coupled to the first driver output in the current-mode operation;
a second voltage-mode amplifier output coupled to the second driver output via a third resistor in the voltage-mode operation and coupled to the second driver output via a fourth resistor in the current-mode operation; and
a second current-mode amplifier output coupled to the second driver output in the current-mode operation, wherein output current supplied by the first current-mode amplifier output and the second current-mode amplifier output is greater than output current supplied by the first voltage-mode amplifier output and the second voltage-mode amplifier output.

9. The driver of claim 8 further comprising a fifth resistor coupled between the first and second voltage-mode amplifier outputs in the current-mode operation.

10. The driver of claim 8, wherein the first and the third resistor have equal resistance values.

11. The driver of claim 8, wherein the second and the fourth resistor have equal resistance values.

12. A system comprising:
a digital signal processor (DSP) including an output;
a digital-to-analog converter (DAC) including an input coupled to the output of the DSP and including first and second outputs; and
a driver comprising:
a first driver input adapted to be coupled to the first output of the DSP;
a second driver input adapted to be coupled to the second output of the DSP;
a first driver output;
a second driver output;
an operational amplifier comprising:
a first amplifier input coupled to the first driver input;
a second amplifier input coupled to the second driver input;
a first amplifier output;
a second amplifier output;
a third amplifier output; and
a fourth amplifier output, wherein output current supplied by the second amplifier output and the fourth amplifier output is greater than output current supplied by the first amplifier output and the third amplifier output;
a first resistor;
a first switch to selectively couple the first amplifier output to the first driver output via the first resistor;
a second resistor;
a second switch to selectively couple the first amplifier output to the first driver output via the second resistor;
a third resistor;

a third switch to selectively couple the third amplifier output to the second driver output via the third resistor;

a fourth resistor;

a fourth switch to selectively couple the third amplifier output to the second driver output via the fourth resistor;

a fifth resistor;

a fifth switch to selectively couple the first amplifier output to the third amplifier output via the fifth resistor;

a sixth switch to selectively couple the second amplifier output to the first driver output; and a seventh switch to selectively couple the fourth amplifier output to the second driver output.

13. The system of claim 12, wherein the first and the third resistor have equal resistance values and the second and the fourth resistor have equal resistance values.

14. A system comprising:

a digital signal processor (DSP) including an output;

a digital-to-analog converter (DAC) including an input coupled to the output of the DSP and including first and second outputs; and a dual-mode driver configured for a voltage-mode operation and a current-mode operation, the driver comprising:

a first driver input;

a second driver input;

a first driver output;

a second driver output;

an operational amplifier comprising:

a first amplifier input coupled to the first driver input;

a second amplifier input coupled to the second driver input;

a first voltage-mode amplifier output coupled to the first driver output via a first resistor in the voltage-mode operation and coupled to the first driver output via the first resistor in the current-mode operation, wherein the first resistor has a first resistance value in the voltage-mode operation and has a second resistance value in the current-mode operation;

a first current-mode amplifier output coupled to the first driver output in the current-mode operation;

a second voltage-mode amplifier output coupled to the second driver output via a second resistor in the voltage-mode operation and coupled to the second driver output via the second resistor in the current-mode operation, wherein the second resistor has the first resistance value in the voltage-mode operation and has the second resistance value in the current-mode operation; and a second current-mode amplifier output coupled to the second driver output in the current-mode operation, wherein output current supplied by the first current-mode amplifier output and the second current-mode amplifier output is greater than output current supplied by the first voltage-mode amplifier output and the second voltage-mode amplifier output.

15. The system of claim 14, further comprising a third resistor coupled between the first and second voltage-mode amplifier outputs in the current-mode operation.

16. The driver of claim 1, wherein:

the first switch includes a first terminal coupled to the first amplifier output;

the first resistor includes a first terminal coupled to a second terminal of the first switch and a second terminal coupled to the first driver output;

the second switch includes a first terminal coupled to the first amplifier output;

the second resistor includes a first terminal coupled to a second terminal of the second switch and a second terminal coupled to the first driver output;

the third switch includes a first terminal coupled to the third amplifier output;

the third resistor includes a first terminal coupled to a second terminal of the third switch and a second terminal coupled to the second driver output;

the fourth switch includes a first terminal coupled to the third amplifier output;

the fourth resistor includes a first terminal coupled to a second terminal of the fourth switch and a second terminal coupled to the second driver output;

the fifth switch includes a first terminal coupled to the first amplifier output;

the fifth resistor including a first terminal coupled to a second terminal of the fifth switch and a second terminal coupled to the third amplifier output;

the sixth switch includes a first terminal coupled to the second amplifier output and a second terminal coupled to the first driver output; and the seventh switch including a first terminal coupled to the fourth amplifier output and a second terminal coupled to the second driver output.

17. The system of claim 12, wherein:

the first switch includes a first terminal coupled to the first amplifier output;

the first resistor includes a first terminal coupled to a second terminal of the first switch and a second terminal coupled to the first driver output;

the second switch includes a first terminal coupled to the first amplifier output;

the second resistor includes a first terminal coupled to a second terminal of the second switch and a second terminal coupled to the first driver output;

the third switch includes a first terminal coupled to the third amplifier output;

the third resistor includes a first terminal coupled to a second terminal of the third switch and a second terminal coupled to the second driver output;

the fourth switch includes a first terminal coupled to the third amplifier output;

the fourth resistor includes a first terminal coupled to a second terminal of the fourth switch and a second terminal coupled to the second driver output;

the fifth switch includes a first terminal coupled to the first amplifier output;

the fifth resistor including a first terminal coupled to a second terminal of the fifth switch and a second terminal coupled to the third amplifier output;

the sixth switch includes a first terminal coupled to the second amplifier output and a second terminal coupled to the first driver output; and the seventh switch including a first terminal coupled to the fourth amplifier output and a second terminal coupled to the second driver output.

* * * * *